United States Patent [19]

Nakanowatari et al.

[11] Patent Number: 4,640,581
[45] Date of Patent: Feb. 3, 1987

[54] FLEXIBLE PRINTED CIRCUIT BOARD FOR A DISPLAY DEVICE

[75] Inventors: Jun Nakanowatari, Miyagi; Mitsuo Machida, Fukuoka; Toshiyuki Okamoto; Yoshihiro Nakura, both of Iwaki, all of Japan

[73] Assignee: Alps Electric Co., Ltd., Japan

[21] Appl. No.: 686,706

[22] Filed: Dec. 27, 1984

[30] Foreign Application Priority Data

Dec. 28, 1983 [JP] Japan ............................ 58-204060[U]

[51] Int. Cl.⁴ .............................................. G02F 1/13
[52] U.S. Cl. ............................ 350/331 R; 350/332; 350/336
[58] Field of Search ............... 350/331 R, 332, 336

[56] References Cited

U.S. PATENT DOCUMENTS

| | | | |
|---|---|---|---|
| 4,164,071 | 8/1979 | Kruzich | 29/625 |
| 4,386,293 | 5/1983 | Waldron | 350/336 X |
| 4,487,480 | 12/1984 | Nonomura et al. | 350/336 X |
| 4,549,174 | 11/1985 | Funada et al. | 350/336 X |
| 4,587,038 | 5/1986 | Tamura | 350/336 X |
| 4,589,734 | 5/1986 | Needham et al. | 350/336 |

*Primary Examiner*—John K. Corbin
*Assistant Examiner*—Richard F. Gallivan
*Attorney, Agent, or Firm*—Guy W. Shoup

[57] ABSTRACT

A flexible printed circuit board has one end to be soldered to the terminal section of a display device, such as a liquid crystal display, the terminal section being used for connection to an external circuit. The end of the circuit board is provided with a pair of protrusions on opposite sides. The display device has a small base sheet and a large base sheet bonded together to form a cell. When the protrusions are caused to bear on the side of the cell, a given gap is formed between the portion of the aforementioned end other than the protrusions and the small base sheet of the display device.

3 Claims, 4 Drawing Figures

FLEXIBLE PRINTED CIRCUIT BOARD FOR A DISPLAY DEVICE

FIELD OF THE INVENTION

The present invention relates to a flexible printed circuit board soldered to the terminal section of a display device, such as a liquid crystal display, electroluminescent display, electrolytic display, or the like, the terminal section being used for connection to an external circuit.

BACKGROUND OF THE INVENTION

A liquid crystal display is shown in FIGS. 1 and 2, where a small base sheet 1 and a large base sheet 2 are joined together by an adhesive 3 such as epoxy resin, and a cell 5 in which liquid crystal material 4 is sealed is formed. The large base sheet 2 has an end portion that extends outwardly of the cell 5. A terminal section 6 for connection to an external circuit is formed on the upper surface of this outwardly extending portion. In this example, the terminal section 6 consists of a transparent electrode layer 7 and a silver layer 8 formed on the layer 7. One end of a flexible printed circuit board 10 is soldered to the silver electrode layer 8 via a solder layer 9. A resin body 11 for holding the terminals is applied between the side of the cell 5 and the end of the circuit board 10 to secure the board 10 to the cell 5.

In the conventional flexible printed circuit board 10 constructed as described above, it has been difficult to keep the gap between the end of the board 10 and the small base sheet 1 constant when the soldering operation is effected. Hence, the produced devices have varied widely. In case where the gap between the end of the circuit board 10 and the small base sheet 1 is small, it is difficult to remove the flux which was used for soldering by cleansing. Further, since the resin 11 for holding the terminals does not sufficiently penetrate into the region between the circuit board 10 and the small base plate 1, the adhesive strength that bonds together the board 10 and the cell 5 has sometimes been insufficient. On the other hand, where the gap between the circuit board 10 and the small base sheet 1 is too large, it is difficult to hold the board 10 in position and so a misalignment tends to occur during soldering operation, causing inferior electrical connection.

SUMMARY OF THE INVENTION

It is the main object of the present invention to provide a flexible printed circuit board which can be readily held in position when its one end is soldered to the terminal section of a display device that is used for connection to an external circuit, and which permits flux to be easily removed after the soldering operation and allows resin for holding terminals to penetrate into the space between the flexible printed circuit board and a small base sheet, whereby the circuit board is firmly fixed to the cell of the display device.

This object is achieved in accordance with the present invention by the provision of a flexible printed circuit board having one end soldered to the external circuit-connecting terminal section of a display device in which a small base sheet and a large base sheet are bonded together to form a cell, said one end being provided with protrusions which act to form a given gap between the portion of the one end other than the protrusions and the small base sheet of the display device when the protrusions bear on the side of the cell of the display device.

Accordingly, when the flexible printed circuit board is subjected to soldering operation, the board can be placed in position by causing the protrusions of the end of the board to bear on the side of the cell. After the soldering operation, the given gap is formed between the portion of the end of the board other than the protrusions and the small base sheet, and therefore flux can be removed through this gap. In addition, a resin body for retaining terminals can be injected through the gap.

The gap formed between the end of the board and the small base sheet preferably lies approximately in the range from 0.2 mm to 1.0 mm. If it is less than 0.2 mm, removal of flux and injection of a resin for holding terminals cannot be satisfactorily carried out. If it is in excess of 1.0 mm, there arises the difficulty that the space available for soldering is limited.

Although no specific limitations are imposed on the position and shape of the protrusions formed on the end of the circuit board, it is desired that they be located in opposite sides of the end as an example. In this case, a gap is formed in the center of the end, making removal of flux and injection of the resin for holding terminals easier.

DETAILED DESCRIPTION OF THE INVENTION

Figure 1:
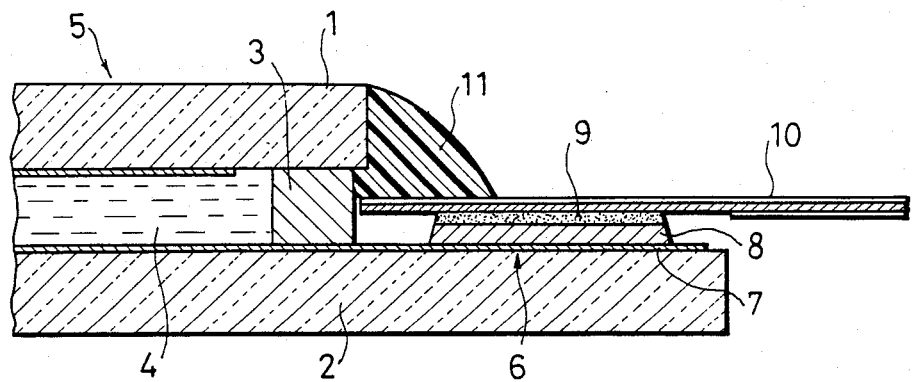
FIG. 1 is a cross-sectional view showing the manner in which a liquid crystal display and a conventional flexible printed circuit board are soldered together.
Figure 2:
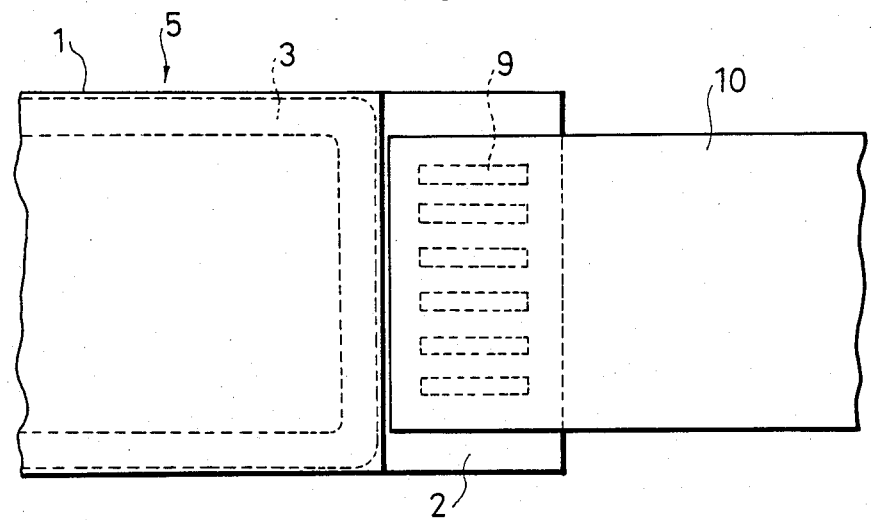
FIG. 2 is a plan view showing a condition similar to FIG. 1, but in which the resin for holding the terminals has been removed.
Figure 3:
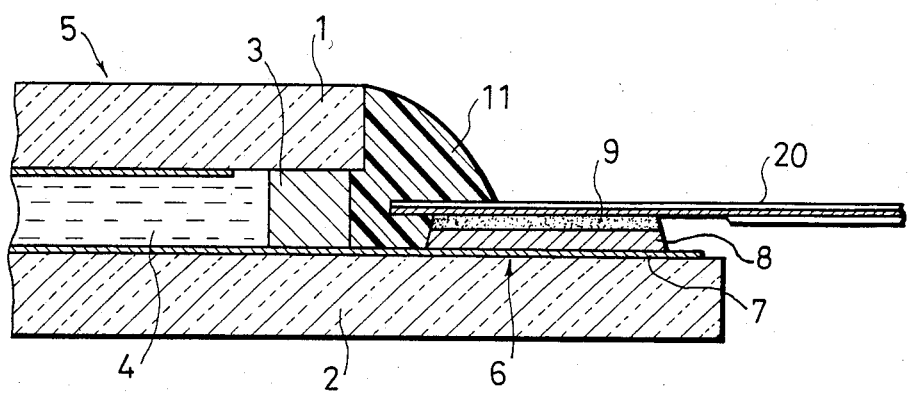
FIG. 3 is a cross-sectional view showing the manner in which a liquid crystal display and a flexible printed circuit board embodying the present invention are soldered together.
Figure 4:
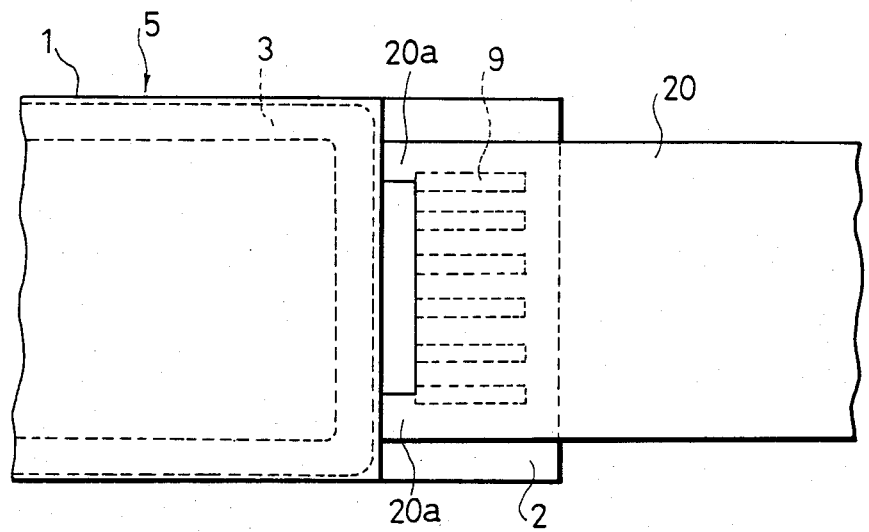
FIG. 4 is a plan view showing a condition similar to FIG. 3, but in which the resin for holding the terminals has been removed.

Referring to FIGS. 3 and 4, a liquid crystal display to which the present invention is applied is constructed similarly to that shown in FIGS. 1 and 2. Specifically, the display includes a transparent electrode which is formed by depositing ITO or similar material on a small base sheet 1 and patterning it, the ITO being In$_2$O$_3$, i.e., a transparent oxide, doped with SnO. Further, the display includes a large base sheet 2 bonded to the small base sheet 1 by an adhesive 3, such as epoxy resin, such that a cell 5 in which liquid crystal material 4 is sealed is formed. In this example, before the liquid crystal display is assembled, a paste for a metal-glaze thick-film silver electrode is applied by screen printing to a transparent electrode layer 7, which is brought to the outside of the cell 5 on the large base sheet 2 and constitutes a terminal section 6 for connection to the external circuit. A silver electrode layer 8 has previously been formed by baking at 520° C. for 15 minutes.

A flexible printed circuit board 20 embodying the present invention comprises a base of polyimide or similar material on which wirings are printed. Protrusions 20a having a length of 0.6 mm are formed on opposite sides of one end of the board.

The circuit board 20 was soldered to the external circuit-connecting terminal region 6 of the liquid crystal display in the manner described below. First, a flux produced by Alphametal Co., Ltd. under the product name "Flux SA880" was applied to the silver electrode layer 8. Then, the terminal section 6 for connection to the external circuit was dipped into a solder bath for preliminary soldering. Subsequently, the protrusions 20a on the end of the circuit board 20 were caused to bear on the side of the cell 5, and the board 20 was properly located relative to the terminal section 6. Then, both components were heated using a Thermocontrol Welder manufactured by Nippon Avionics Co., Ltd., Japan, at a temperature of 300° C. for 1.6 seconds to solder the board to the terminal section. Thus, the flexible printed circuit board 20 was connected onto the silver electrode layer 7 via the solder layer 8. Thereafter, the flux was cleansed in a cleansing bath using Freon. Rock Tight 358 which is an ultraviolet ray-setting resin produced by Nippon Rock Tight Co., Ltd., Japan, was then applied between the end of the circuit board 20 and the cell 5, and the resin was exposed to ultraviolet rays so that it might be set. As a result, a resin body 11 for fixing the terminals was formed.

Observation using a microscope has shown that the residue of the flux does not exist between the successive terminals at the junction of the circuit board 20 and the terminal section 6 and that the resin 11 has sufficiently penetrated into the regions between the terminals. Consequently, the circuit board 20 was firmly joined.

As thus far described, according to the present invention, the protrusions are formed on the end of the flexible printed circuit board, and therefore when the protrusions are placed in contact with the side of the cell and located in position for soldering the circuit board to the external circuit-connecting terminal section of the display device, a given gap can be formed between the small base sheet of the device and the end of the circuit board. This gap facilitates cleansing of flux and injection of the resin for holding the terminals. Therefore, the circuit board can be firmly secured to the terminal section for connection to the external circuit.

What is claimed is:

1. In a flexible printed circuit board having one end soldered to the terminal section of a display device which is used for connection to an external circuit, the display device having a small base sheet and a large base sheet bonded together to form a cell, the improvement wherein said end is provided with protrusions which, when caused to bear on the side of the cell of the display device, form a given gap between the portion of said end other than the protrusions and the small base sheet of the display device.

2. In a flexible printed circuit board as set forth in claim 1, the further improvement wherein said gap ranges from 0.2 mm to 1.0 mm.

3. In a flexible printed circuit board as set forth in claim 1 or 2, the further improvement wherein the protrusions on the end are formed on opposite sides.

* * * * *